(12) United States Patent
Li et al.

(10) Patent No.: US 10,666,843 B2
(45) Date of Patent: May 26, 2020

(54) IMAGING CHIP PACKAGING STRUCTURE AND CAMERA DEVICE HAVING THE SAME

(71) Applicants: TRIPLE WIN TECHNOLOGY(SHENZHEN) CO. LTD., Shenzhen (CN); HON HAI PRECISION INDUSTRY CO., LTD., New Taipei (TW)

(72) Inventors: Kun Li, Shenzhen (CN); Shin-Wen Chen, New Taipei (TW); Long-Fei Zhang, Guangdong (CN); Xiao-Mei Ma, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 12 days.

(21) Appl. No.: 16/165,824

(22) Filed: Oct. 19, 2018

(65) Prior Publication Data
US 2019/0394366 A1   Dec. 26, 2019

(30) Foreign Application Priority Data
Jun. 26, 2018  (CN) .......................... 2018 1 0673837

(51) Int. Cl.
*H04N 5/225*   (2006.01)
*H01L 27/146*  (2006.01)
*H01R 12/77*   (2011.01)

(52) U.S. Cl.
CPC ..... *H04N 5/2253* (2013.01); *H01L 27/14618* (2013.01); *H01L 27/14621* (2013.01); *H01L 27/14629* (2013.01); *H01R 12/77* (2013.01)

(58) Field of Classification Search
CPC ............ H04N 5/2253; H01L 27/14629; H01L 27/14621; H01L 27/14618; H01R 12/77
See application file for complete search history.

(56) References Cited

U.S. PATENT DOCUMENTS

| | | | |
|---|---|---|---|
| 2011/0194023 A1* | 8/2011 | Tam ..................... | H04N 5/2253 348/374 |
| 2011/0291215 A1 | 12/2011 | Tu et al. | |
| 2014/0055669 A1* | 2/2014 | Chen ..................... | H04N 5/2253 348/374 |
| 2014/0312450 A1* | 10/2014 | Tagle .................. | H01L 27/1469 257/443 |
| 2015/0021730 A1* | 1/2015 | Chen ................. | H01L 27/14627 257/432 |

FOREIGN PATENT DOCUMENTS

| | | |
|---|---|---|
| TW | 201143039 A | 12/2011 |
| TW | 201505434 A | 2/2015 |
| TW | M550473 U | 10/2017 |

\* cited by examiner

*Primary Examiner* — Gevell V Selby
(74) *Attorney, Agent, or Firm* — ScienBiziP, P.C.

(57) ABSTRACT

An imaging chip packaging structure includes a circuit substrate, an imaging chip, and a pedestal. The circuit substrate has a first through hole extending through the circuit substrate. The imaging chip comprises a photosensitive area, and the first through hole through the substrate exposes the photosensitive area. The pedestal is integrated with the circuit substrate. The pedestal is formed on a first surface of the circuit substrate and comprises a second through hole on an optical path of the light reaching the imaging chip.

17 Claims, 4 Drawing Sheets

IMAGING CHIP PACKAGING STRUCTURE AND CAMERA DEVICE HAVING THE SAME

FIELD

The subject matter herein generally relates to imaging chip packaging structure and camera device having the same.

BACKGROUND

To reduce a size of a camera module, a light sensor (imaging) chip is usually mounted on a printed circuit board through a chip on board (COB) technology. However, the COB technology still needs to mount a supporting frame on the printed circuit board, which has a thick wall. There is room for improvement in imaging chip packaging structure and size reduction of a camera module.

BRIEF DESCRIPTION OF THE DRAWINGS

Implementations of the present disclosure will now be described, by way of example only, with reference to the attached figures.

DETAILED DESCRIPTION

Figure 1:
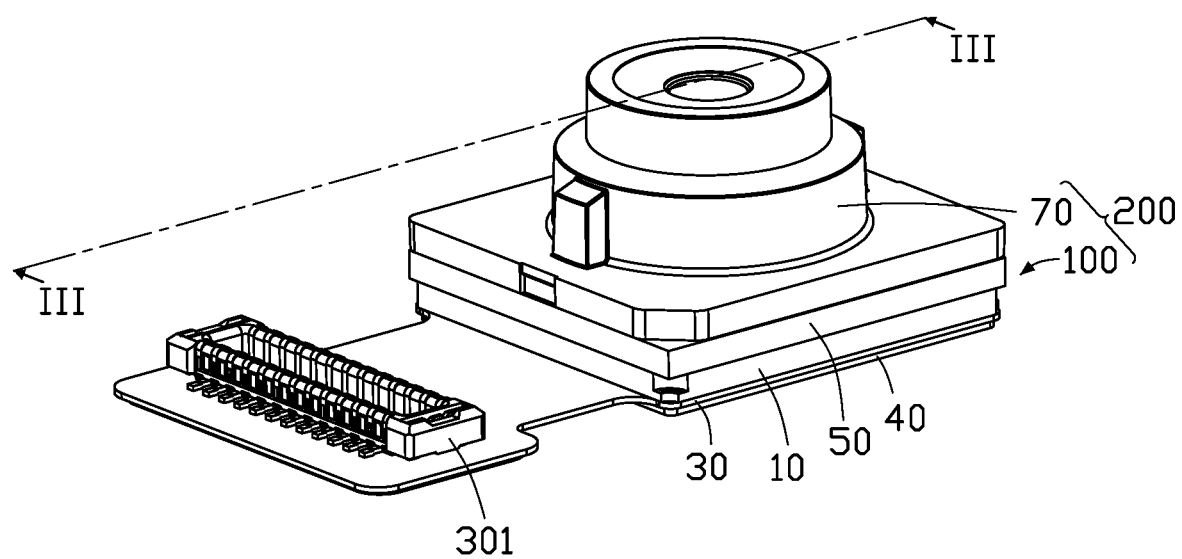
FIG. 1 is an isometric view of a camera device having an imaging chip packaging structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is present by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
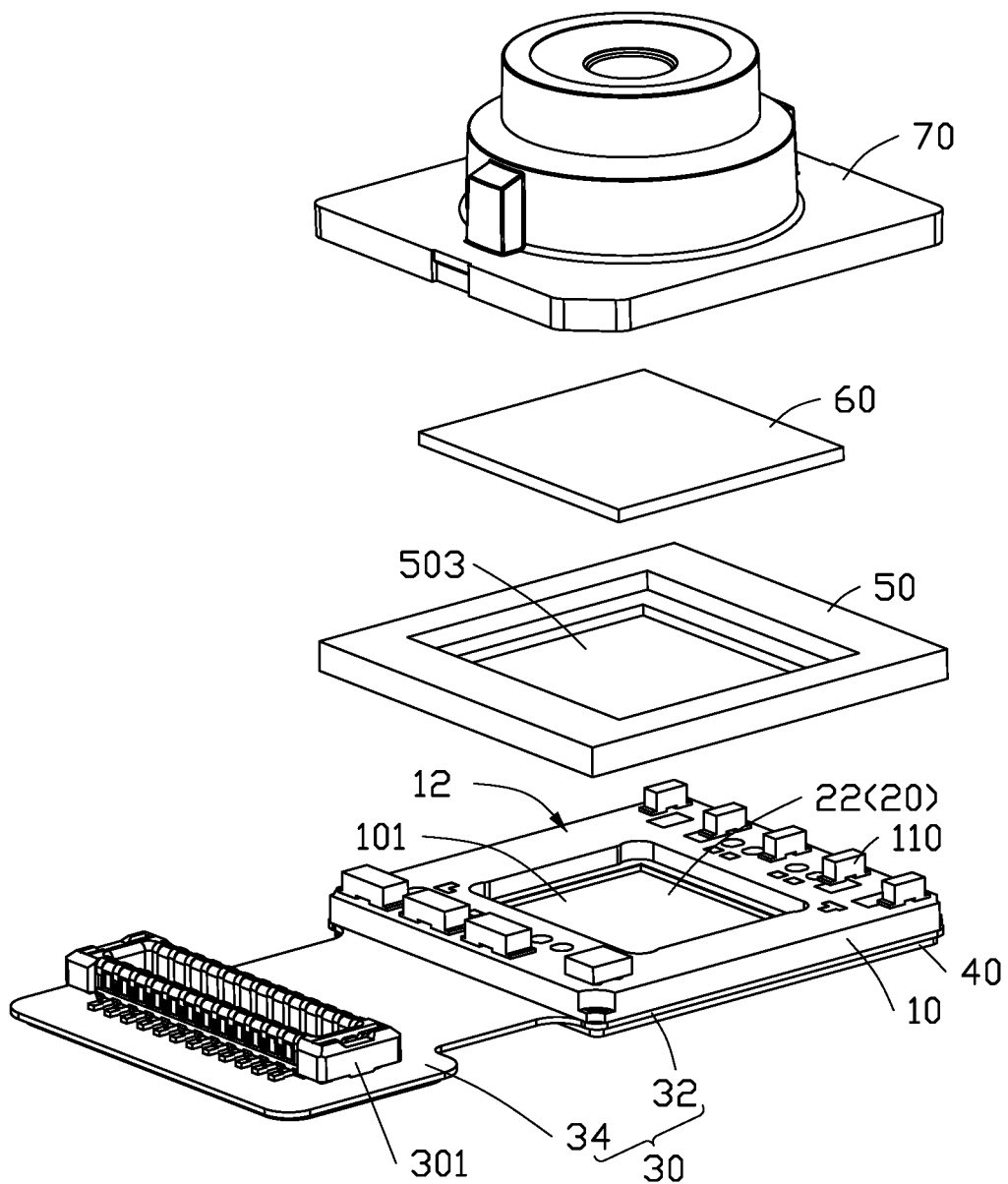
FIG. 2 is an exploded isometric view of the camera device in FIG. 1.
Figure 3:
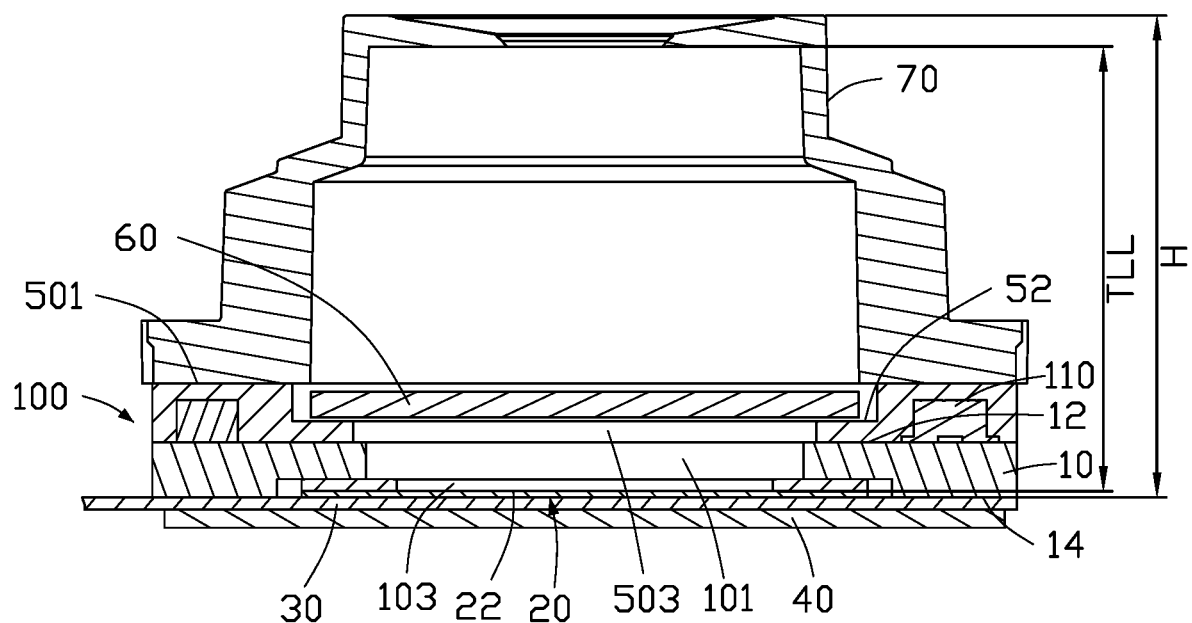
FIG. 3 is a cross-sectional view of the camera device in FIG. 1.
Figure 3:
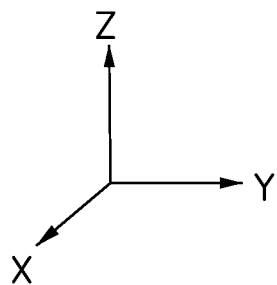

FIGS. 1-3 illustrate a camera device 200 according to one embodiment. The camera device 200 includes an imaging chip packaging structure 100 and an imaging module 70 mounted on the imaging chip packaging structure 100.

The imaging chip packaging structure 100 includes a circuit substrate 10, an imaging chip 20, a flexible circuit board 30, a reflecting sheet 40, a packaging pedestal 50, and a light filter sheet 60, as shown in FIG. 2.

In the present embodiment, the circuit substrate 10 is a ceramic substrate or a rigid circuit board. Referring to FIG. 3, the circuit substrate 10 includes a first surface 12 and a second surface 14 opposite to the first surface 12. The circuit substrate 10 is provided with a first through hole 101 through the first surface 12 and the second surface 14.

The circuit substrate 10 further defines a receiving groove 103. The receiving groove 103 is defined from the second surface 14 to the first surface 12, and a diameter of the receiving groove 103 is larger than a size of the first through hole 101, and the receiving groove 103 is in air communication with the first through hole 101. Referring to FIG. 2, a plurality of circuit elements 110 are mounted around the first through hole 101 of the first surface 12. Circuit element 110 may be, but is not limited to, resistors, capacitors, diodes, transistors, potentiometers, relays or drives, and so on.

Referring to FIG. 3, the imaging chip 20 is mounted in the receiving groove 103 of the circuit substrate 10 by flip chip technology, that is, the imaging chip 20 is electrically connected to the circuit substrate 10 using flip chip bonding. The imaging chip 20 includes a photosensitive area 22, and the first through hole 101 exposes the photosensitive area 22. The photosensitive area 22 is used for photosensitivity. The circuit element 110 is electrically connected with the imaging chip 20 for signal sensing and imaging of the imaging chip 20.

As shown in FIG. 3, the imaging chip 20 is mounted on the circuit substrate 10 by flip chip technology. When the imaging chip packaging structure 100 is used to form the camera device 200, the overall height H of the camera device 200 does not increase, but the total track length (TTL) is increased accordingly, so that a height of the camera device 200 in the Z direction is reduced.

The flexible circuit board 30 is mounted on the second surface 14 of the circuit substrate 10 and is electrically connected to the imaging chip 20, the flexible circuit board 30 is used to realize signal transmission of the imaging chip 20 and an electronic device (not shown) mounted on the camera device 200. Surface of the flexible circuit board 30 contacts the imaging chip 20. The imaging chip 20 is enclosed in the receiving groove 103. That is, the flexible circuit board 30 is configured to protect the imaging chip 20 and prevent the imaging chip 20 from falling out of the receiving groove 103.

Referring to FIG. 2, in the present embodiment, the flexible circuit board 30 includes a main portion 32 and an extending portion 34 connected to the main portion 32. The imaging chip 20 is located on the main portion 32. The extending portion 34 has a connector 301, and the connector 301 is electrically connected to the imaging chip 20 and configured to transmit commands and signals between the optical camera device 200 and an external electrical device (not shown).

The reflecting sheet 40 is disposed on a surface of the flexible circuit board 30 opposite to the circuit substrate 10.

The reflecting sheet 40 reflects stray light and light noise that is incident on bottom of the camera device 200, thus prevent reduction in image shooting quality. The reflecting sheet 40 also protects the flexible circuit board 30, avoiding damage to the flexible circuit board 30 when jarred. The reflecting sheet 40 is a metal sheet to enhance a heat dissipation performance of the imaging chip packaging structure 100.

The packaging pedestal 50 is integrated with the circuit substrate 10, by molding on board (MOC) technology, to reduce the size of the imaging chip packaging structure 100 in the X-Y directions. Compared with previous techniques, the packaging pedestal 50 replaces a supporting frame, thus, eliminating the wall thickness of the support base and reduces the size in the X-Y direction.

The packaging pedestal 50 is formed on the first surface 12 of the circuit substrate 10, and the packaging pedestal 50 also covers the circuit elements 110. The packaging pedestal 50 includes a second through hole 503 on an optical path of the imaging chip 20. In the present embodiment, the material of the packaging pedestal 50 is opaque, and is a black or dark color, to absorb stray light and prevent ghosting.

The method of forming the packaging pedestal 50 can be selected from, but not limited to, injection molding process, molding process, and so on. Material of the packaging pedestal 50 can be selected from but not limited to, nylon, LCP (liquid Crystal Polymer), and PP (Polypropylene), when using injection molding process. Resin can be used in molding process. The packaging pedestal 50 also covers the circuit element 110 to prevent dust falling into the photosensitive area 22.

The light filter sheet 60 is disposed in the second through hole 503 of the packaging pedestal 50. Light rays entering the interior of the imaging module 70 from the optical lens received in the imaging module 70 are first filtered by the light filter sheet 60 and then received by the imaging chip 20. In the present embodiment, the light filter sheet 60 may be an infrared cut-off filter capable of filtering an infrared portion of the light from the optical lens received in the imaging module 70. Thus, the imaging quality of the camera module 70 is improved. Of course, the light filter sheet 60 may also be a transparent sheet.

Referring to FIG. 3, in the present embodiment, the packaging pedestal 50 further includes a bearing surface 501 away from the circuit substrate 10. The bearing surface 501 defines a concave portion 52 surrounding the second through hole 503, and the light filter sheet 60 is mounted in the concave portion 52.

The imaging module 70 is mounted on the bearing surface 501. The light filter sheet 60 is lower than the bearing surface 501, this avoids optical lens received in the imaging module 70 being too close to the light filter sheet 60, such closeness might cause interference and fragmentation of the light filter sheet 60.

Imaging chip 20 senses light that enters the camera module 70. The imaging module 70 is a fixed-focus camera module or a zoom camera module. In the present disclosure, a fixed-focus camera module is a module having a focal length that cannot be freely adjusted. The zoom camera module means that focal length of the camera device 200 can be adjusted by the user.

The light filter sheet 60, the packaging pedestal 50, the circuit substrate 10, and the flexible circuit board 30 are joined together to seal and enclose the imaging chip 20. The light filter sheet 60 protects the imaging chip 20 from dust or other pollutants. The flexible circuit board 30 is configured to prevent the imaging chip 20 from falling out of the receiving groove 103, and the reflecting sheet 40 is configured to protect the flexible circuit board 30 and the imaging chip 20.

Figure 4:
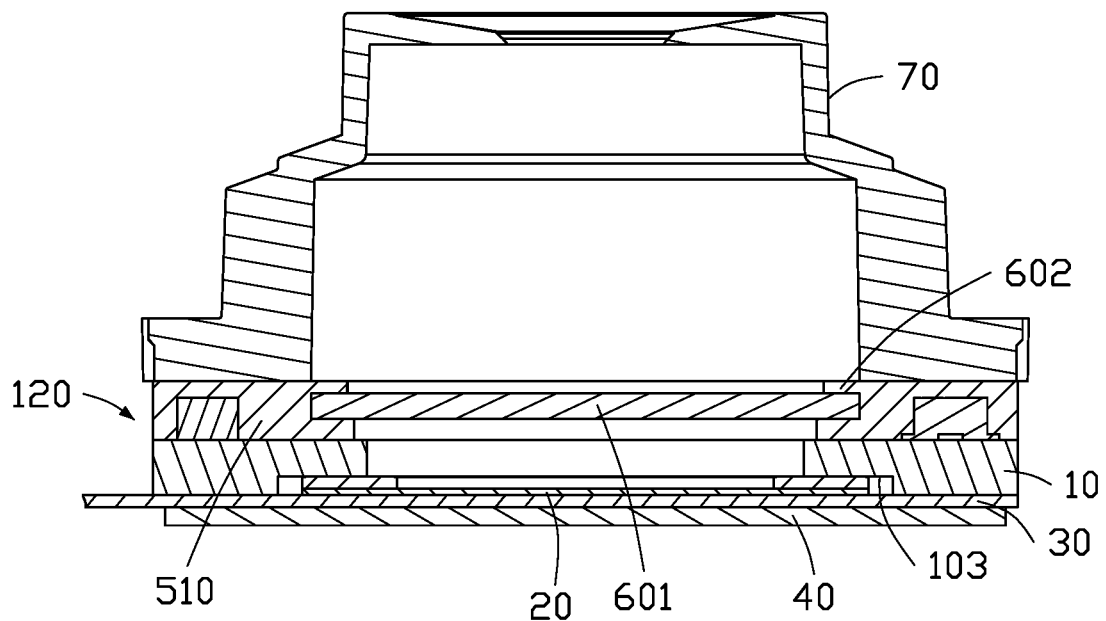
FIG. 4 is a cross-sectional view of a camera device in another embodiment.

FIG. 4 illustrates a camera device 300 according to another embodiment. The camera device 300 in FIG. 4 is similar to the camera device 200 in FIG. 3. The difference between the camera device 300 and the camera device 200 in FIG. 3 is that the imaging chip packaging structure 120 in the camera device 300 is different from the imaging chip packaging structure 100 in the camera device 200. The imaging chip packaging structure 120 includes a light filter sheet 601, and the light filter sheet 601 is integrated with the packaging pedestal 510 during the molding on chip (MOC) process. That is, the material used to mold the packaging pedestal 510 also flows over the edge area of the light filter sheet 601 during molding. A light shield layer 602 is formed on a peripheral area of the light filter sheet 601 with the same material as the packaging pedestal 510. The light shield layer 602 absorbs stray light.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An imaging chip packaging structure comprising:
   a circuit substrate comprising a first surface and a second surface opposite to the first surface, the circuit substrate being provided with a first through hole running through the first surface and the second surface;
   an imaging chip mounting on the second surface of the circuit substrate, the imaging chip comprises a photosensitive area, and the first through hole exposes the photosensitive area; and
   a packaging pedestal being integrated with the circuit substrate, the packaging pedestal being formed on the first surface of the circuit substrate, the packaging pedestal comprises a second through hole locating on an optical path of the imaging chip; wherein the imaging chip packaging structure further comprises a flexible circuit board mounted on the second surface of the circuit substrate and a reflecting sheet disposed on a surface of the flexible circuit board opposite to the circuit substrate, the flexible circuit board is electrically connected to the imaging chip, and wherein the packaging pedestal further comprises a bearing surface away from the circuit substrate, the bearing surface defines a concave portion surrounding the second through hole, and a light filter sheet is mounted in the concave portion.

2. The packaging structure of claim 1, wherein the circuit substrate is a ceramic substrate or a rigid circuit board.

3. The packaging structure of claim 2, wherein the circuit substrate further comprises a receiving groove, the receiving groove is opened from the second surface to the first surface, a diameter of the receiving groove is larger than a diameter of the first through hole, and the receiving groove is in air communication with the first through hole, and the imaging chip is mounted in the receiving groove and electrically connected to the circuit substrate through flip chip bonding.

4. The packaging structure of claim 3, wherein a bottom surface of the imaging chip is leveled with the second surface of the circuit substrate.

5. The packaging structure of claim 2, wherein the flexible circuit board covers the imaging chip.

6. The packaging structure of claim 5, wherein the flexible circuit board comprises a main portion and an extending portion connected to the main portion, a connector is mounted on the extending portion.

7. The packaging structure of claim 1, wherein the reflecting sheet is made of metal.

8. The packaging structure of claim 1, wherein the light filter sheet is lower in height than the bearing surface.

9. The packaging structure of claim 8, wherein the packaging pedestal is opaque.

10. The packaging structure of claim 9, wherein a material of the packaging pedestal is nylon, liquid crystal polymer, or polypropylene.

11. The packaging structure of claim 10, wherein a peripheral area of the light filter sheet is formed with a light shield layer.

12. The packaging structure of claim 11, wherein the light shield layer and the packaging pedestal are made of a same material.

13. A camera device, comprising:
an imaging chip packaging structure and an imaging module mounted on the imaging chip packaging structure, wherein the imaging chip packaging structure comprises:
a circuit substrate comprising a first surface and a second surface opposite to the first surface, the circuit substrate being provided with a first through hole running through the first surface and the second surface;
an imaging chip mounting on the second surface of the circuit substrate, the imaging chip comprises a photo-sensitive area, and the first through hole exposes the photosensitive area; and
a packaging pedestal being integrated with the circuit substrate, the packaging pedestal being formed on the first surface of the circuit substrate, the packaging pedestal comprises a second through hole locating on an optical path of the imaging chip; wherein the imaging chip packaging structure further comprises a flexible circuit board mounted on the second surface of the circuit substrate and a reflecting sheet disposed on a surface of the flexible circuit board opposite to the circuit substrate, the flexible circuit board is electrically connected to the imaging chip, and wherein the packaging pedestal further comprises a bearing surface away from the circuit substrate, the bearing surface defines a concave portion surrounding the second through hole, and a light filter sheet is mounted in the concave portion.

14. The camera device of claim 13, wherein the circuit substrate is further opened with a receiving groove, the receiving groove is opened from the second surface to the first surface, a diameter of the receiving groove is larger than a diameter of the first through hole, and the receiving groove is in air communicated with the first through hole, and the imaging chip is mounted in the receiving groove and electrically connected the circuit substrate through flip chip bonding.

15. The camera device of claim 14, wherein a bottom surface of the imaging chip is leveled with the second surface of the circuit substrate.

16. The camera device of claim 13, wherein the light filter sheet is lower in height than the bearing surface.

17. The camera device of claim 16, wherein a peripheral area of the light filter sheet is formed with a light shield layer.

* * * * *